(12) United States Patent
Cheng et al.

(10) Patent No.: US 10,155,659 B2
(45) Date of Patent: Dec. 18, 2018

(54) VACUUM SEALED MEMS AND CMOS PACKAGE

(71) Applicant: Taiwan Semiconductor Manufacturing Company, Ltd., Hsinchu (TW)

(72) Inventors: Chun-Wen Cheng, Zhubei (TW); Yi-Chuan Teng, Zhubei (TW); Hung-Chia Tsai, Taichung (TW); Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/722,214

(22) Filed: Oct. 2, 2017

(65) Prior Publication Data
US 2018/0029881 A1 Feb. 1, 2018

Related U.S. Application Data

(62) Division of application No. 14/137,672, filed on Dec. 20, 2013, now Pat. No. 9,776,856.

(51) Int. Cl.
*B81B 7/00* (2006.01)
*B81C 1/00* (2006.01)
*H01L 21/768* (2006.01)

(52) U.S. Cl.
CPC ............ *B81C 1/0023* (2013.01); *B81B 7/007* (2013.01); *B81C 1/00238* (2013.01); *B81C 1/00301* (2013.01); *H01L 21/76898* (2013.01); *B81B 2201/0235* (2013.01); *B81B 2201/0242* (2013.01); *B81B 2207/096* (2013.01); *H01L 2224/11* (2013.01); *H01L 2924/16235* (2013.01)

(58) Field of Classification Search
CPC . B81C 1/00301; B81B 2201/0235–2201/0242
See application file for complete search history.

(56) References Cited

U.S. PATENT DOCUMENTS 8,809,972 B2 8/2014 Huang et al.
9,278,850 B2 3/2016 Yoshizawa
(Continued)

FOREIGN PATENT DOCUMENTS

TW 201200461 A 1/2012
TW 201351572 A 12/2013

*Primary Examiner* — Stephen Bradley
(74) *Attorney, Agent, or Firm* — Slater Matsil, LLP

(57) ABSTRACT

A vacuum sealed MEMS and CMOS package and a process for making the same may include a capping wafer having a surface with a plurality of first cavities, a first device having a first surface with a second plurality of second cavities, a hermetic seal between the first surface of the first device and the surface of the capping wafer, and a second device having a first surface bonded to a second surface of the first device. The second device is a CMOS device with conductive through vias connecting the first device to a second surface of the second device, and conductive bumps on the second surface of the second device. Conductive bumps connect to the conductive through vias and wherein a plurality of conductive bumps connect to the second device. The hermetic seal forms a plurality of micro chambers between the capping wafer and the first device.

20 Claims, 15 Drawing Sheets

(56) References Cited

U.S. PATENT DOCUMENTS

| | | |
|---|---|---|
| 9,540,232 B2 | 1/2017 | Lee |
| 2012/0001276 A1 | 1/2012 | Huang et al. |
| 2012/0012951 A1 | 1/2012 | Leverrier et al. |
| 2012/0142144 A1* | 6/2012 | Taheri .................... B81B 7/007 438/107 |
| 2012/0267773 A1* | 10/2012 | Ebefors .................. B81B 7/007 257/692 |
| 2012/0241901 A1 | 12/2012 | Kotlanka et al. |
| 2013/0168740 A1 | 7/2013 | Chen |
| 2013/0334620 A1 | 12/2013 | Chu et al. |
| 2014/0151820 A1 | 6/2014 | Howe et al. |
| 2014/0239423 A1 | 8/2014 | Liu |
| 2015/0128703 A1 | 5/2015 | Kaelberer et al. |

\* cited by examiner

VACUUM SEALED MEMS AND CMOS PACKAGE

PRIORITY CLAIM AND CROSS-REFERENCE

This application is a division of U.S. patent application Ser. No. 14/137,672, entitled "Vacuum Sealed MEMS and CMOS Package," filed on Dec. 20, 2013, which application is incorporated herein in its entirety.

BACKGROUND

In the semiconductor process, integrated circuits are fabricated on a semiconductor wafer. Semiconductor wafers can be stacked or bonded on top of each other to form what is referred to as a three-dimensional ("3D") IC. Some semiconductor wafers include micro-electro-mechanical systems ("MEMS"), which involves the technology of forming micro-structures with dimensions in the micrometer scale (one millionth of a meter). Typically, MEMS devices are built on silicon wafers and realized in thin films of materials.

MEMS applications include inertial sensors applications, such as motion sensors, accelerometers, and gyroscopes. Other MEMS applications include optical applications such as movable mirrors, and RF applications such as RF switches and resonators. MEMS devices introduce their own unique requirements into the integration process, however. Electrically interconnecting MEMS devices is an area of unique challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Reference throughout this specification to "one embodiment" or "various embodiments" means that a particular feature, structure, or characteristic described in connection with the embodiment is included in at least one embodiment. Thus, the appearances of the phrases "in one embodiment" or "in various embodiments" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Before addressing illustrative embodiments of the present disclosure in detail, various embodiments and advantageous features thereof will be discussed generally. For instance, in some embodiments wafer level bonding (also referred to herein as "wafer level packaging") is performed between two or more wafers or devices. One device may, for example, be a micro-electro-mechanical systems (MEMS) device and another device may be a capping wafer or a CMOS device. The devices may be bonded together to form a packaged device having a hermetic vacuum environment in micro chambers or cavities between the bonded devices. Throughout various applications of the packaged device, vacuum levels within the packaged micro chambers may vary from about $10^{-5}$ to several hundred mbars, as a result of high thermal budgets for the devices. As pressure may vary within the micro chambers, outgassing may occur from one device to another or from the environment to the micro chambers. The outgassing may affect the vacuum level of the packaged device. Further, outgassing from another device, for example, a CMOS device to a MEMS micro chamber may contain materials used in semiconductor processing. These gases can adversely affect the operation of the MEMS device by changing the intended environment of operation.

Figure 1:
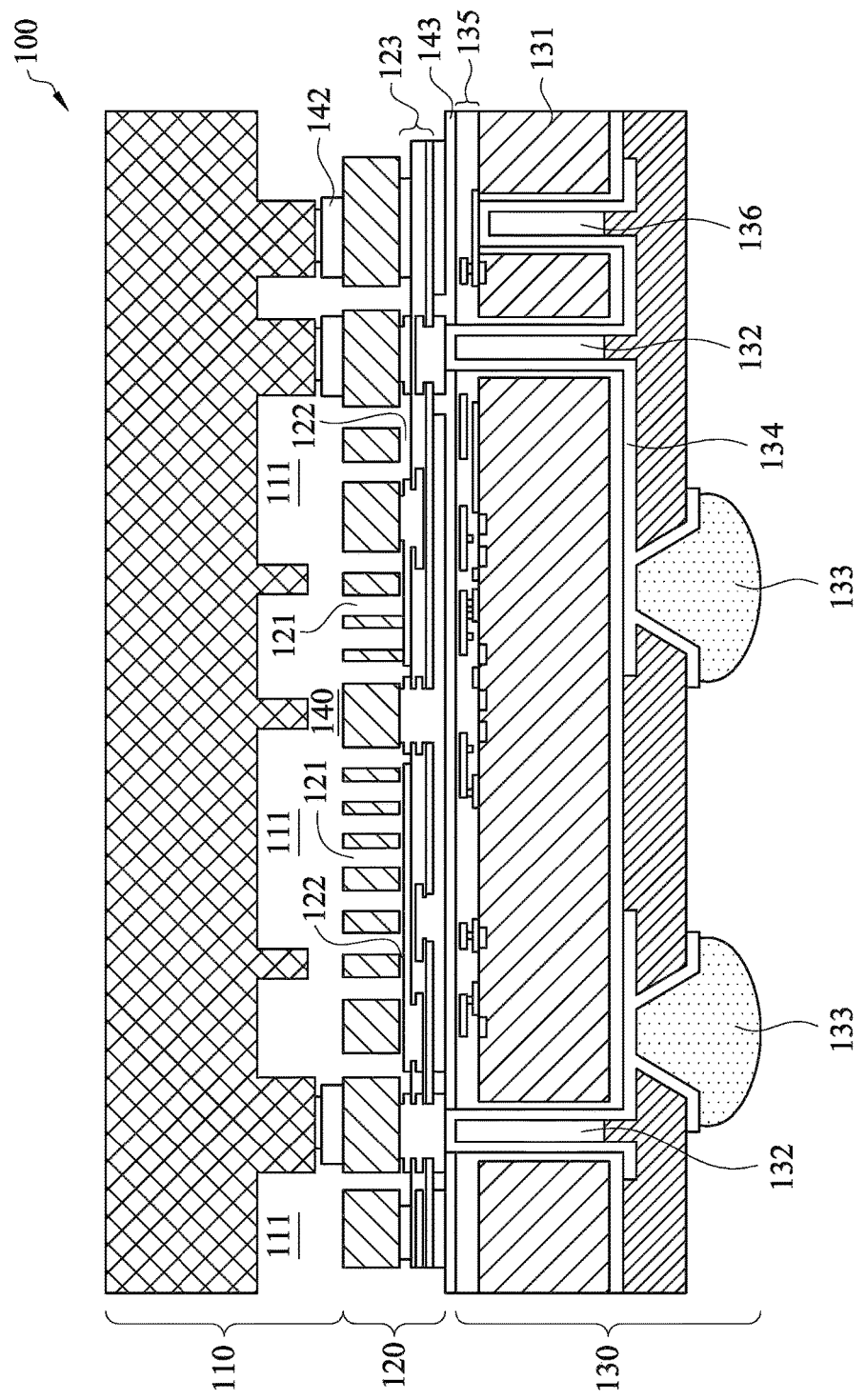
FIG. 1 is a cross sectional view of a semiconductor structure in accordance with various embodiments of the present disclosure.

FIG. 1 illustrates a cross sectional view of a semiconductor structure 100 according to various embodiments. The semiconductor structure 100 includes a capping wafer 110, a first device 120, and a second device 130. The capping wafer 110 may be a silicon wafer or other substrate commonly used in semiconductor process that is capable of being etched and having mechanical strength and material composition that would not outgas into a vacuum environment. The capping wafer includes a number of cavities 111 formed or etched into the capping wafer on one side.

The first device 120 is formed from a semiconductor wafer such as a silicon wafer and includes trenches 121 on one side and various interconnect structures on the other side. Some of the trenches walls of trenches 121 are not connected to the rest of the first device 120 at the bottom, as shown in element 122 in FIG. 1. In other words, some of the trench walls are suspended above the rest of the first device 120 by a lateral connection to the substrate of the first device 120. Thus, the through wall openings 122 in the first device is a part of the micro chamber 140. In some embodiments, the suspended trench walls are a vibrating mass, elastic strings or coils for performing functions in sensors, gyroscopes, accelerometers, RF devices or optical devices. In some embodiments, the bottoms of trench walls directly contact the rest of the substrate. The first device 120 may be a MEMS device or another device having a vacuum micro chamber. The MEMS device may include semiconductor devices such as transistors, inductors, capacitors, and resistors. The various interconnect structures 123 includes conductors and dielectric material between and around the conductors. The conductors of the interconnect structures 123 are capable of withstanding high temperature processing that occurs after the interconnect formation. In some embodiments, the conductors are doped silicon grown or deposited on the substrate of the first device 120. In some embodiments, the conductors are formed of metal and alloys having very high melting temperatures that can withstand high temperature processing of more than 500 or 600 degrees Celsius without deformation or unwanted migration of the material. For example, suitable metals include aluminum and copper.

A hermetic seal 142 is disposed between the first device 120 and the capping wafer 110 to form micro chamber 140. The hermetic seal 142 also bonds the capping wafer 110 and the first device 120 together. The hermetic seal 142 may include different layers. In some embodiments, the hermetic seal 142 includes a eutectic layer formed from two or more metal bonding layers. The two or more metal bonding layers may AlCu, AlGe, In, Au, Sn, Cu, Zr, Ba, Ti, Al, or their alloys. In some embodiments, only one metal bonding layer is in the eutectic layer, for example, using Al or Au to bond with silicon.

A second device 130 includes a substrate 131, a device layer 135 on one side of the substrate 131, and conductive bumps 133 on an opposite side of the substrate 131. The second device 130 also includes conductive through vias 132 that are at least partially filled with a metal connecting the interconnect structure 123 of the first device 120 and conductive bumps 133. The conductive bumps 133 may be located directly on an end of the conductive through vias 132 or be located with an offset from the end of conductive through vias 132 and connected to the conductive through vias 132 by a metal line 134. The second device 130 may also include conductive vias 136 connecting the device layer 135 to conductive bumps 133. The conductive vias 136 do not extend through the device layer 135.

The second device 130 may be an integrated circuit (IC) device, including a CMOS device configured as an application-specific integrated chip (ASIC) device. The second device 130 may also be an active or passive semiconductor device. A bonding layer 143 is disposed between the first device 120 and the second device 130. The conductive through vias 132 extend through a portion of the bonding layer 143. The bonding layer 143 includes a silicon oxide layer, for example.

The semiconductor structure 100 includes external connections only through the conductive bumps 133 on one side of the structure. Because the capping wafer 110, the first device 120, and the second device 130 may be made to be the same size, having external connections on only one side allows a wafer-on-wafer packaging process to be used. In the wafer-on-wafer process, a wafer having many devices thereon is packaged to another wafer of the same size that also have many devices thereon. The packaging process is therefore more efficient because many packages may be packaged at once. A final dicing process singulates the individual semiconductor package from the packaged wafers. Other package schemes may include external connections from more than one side of the package. In those schemes, a chip-on-wafer process having a higher manufacture cost is used.

Another feature of the semiconductor structure 100 of FIG. 1 is the integrity of micro chamber 140. The micro chamber 140 is less susceptible to outgassing from nearby features or loss of vacuum than other designs. The use of a capping wafer 110 and the hermetic seal 142 achieved through eutectic bonding provides a mechanically strong micro chamber 140. Further, the inner surface area of the micro chamber 140 is predominately silicon, both doped and undoped, which does not outgas easily.

The process of forming the semiconductor structure 100 is described below in association with a method 200 in a process flow diagram of FIG. 2, and cross section diagrams of workpieces in various stages of manufacturing in FIGS. 3-15. A workpiece is a partially fabricated semiconductor structure that may include one or more substrates and devices. The devices in a workpiece may be fully or partially completed.

Figure 2:
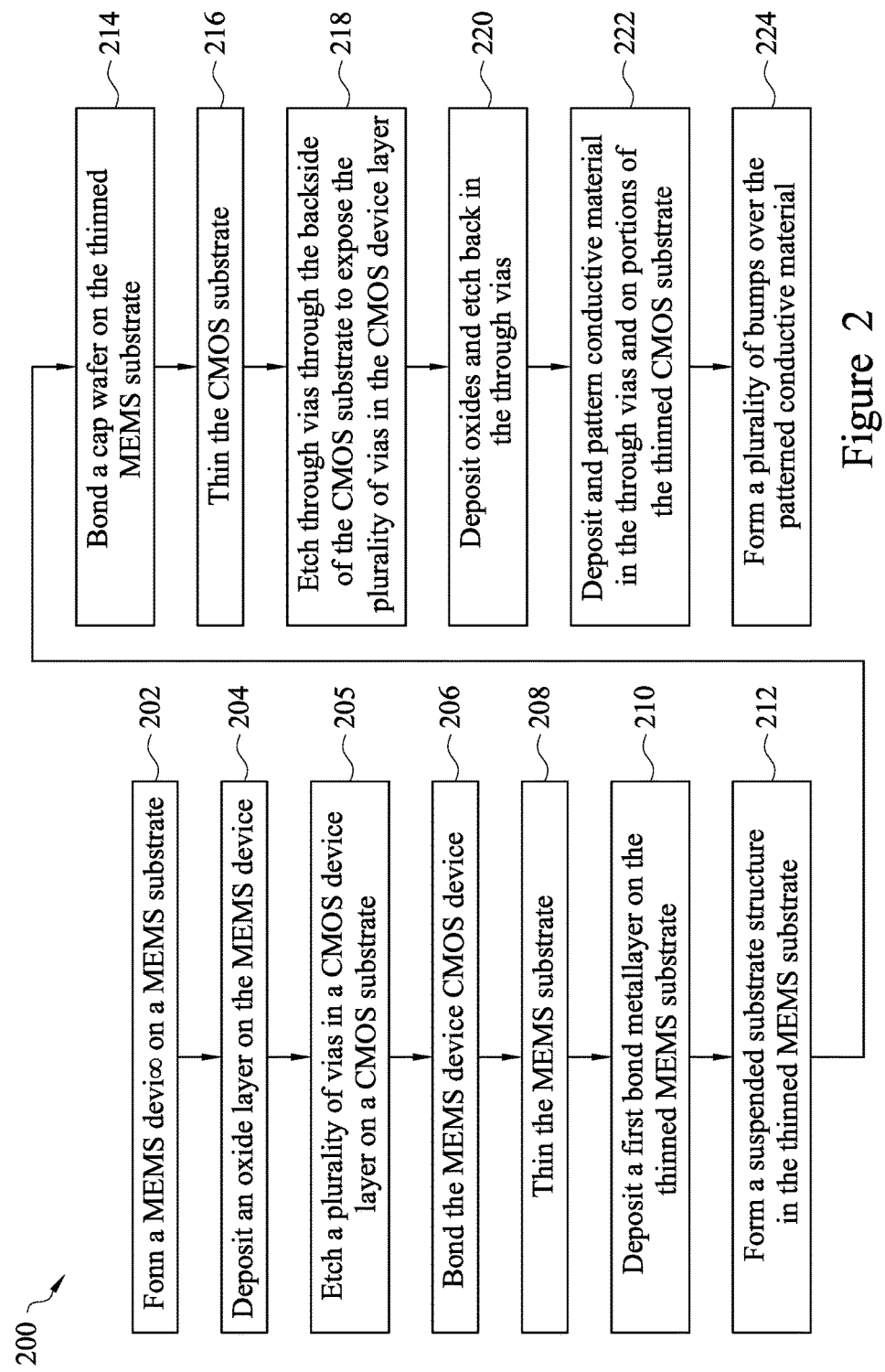
FIG. 2 is a flow diagram for a method of forming a semiconductor structure according to various embodiments.

Referring to FIG. 2, in operation 202, a MEMS device is formed on a MEMS substrate. The MEMS device may be the first device of FIG. 1. The MEMS device may include gyroscopes, accelerometers, other sensors, RF devices, or optical devices. The MEMS substrate is a semiconductor substrate, and may be a silicon wafer, a silicon-on-insulator (SOI) wafer, or any other commonly used semiconductor substrates, including compound wafers having gallium, germanium, or arsenide.

The MEMS device formation may include a number of operations include depositing silicon oxide layers, polysilicon layers, silicon nitride layers, and a gas diffusion barrier layer. These layers are deposited and patterned to form various structures to conduct current or to form a portion of a MEMS device. The polysilicon layers may be doped as deposited or may be doped in a separate process to form conductive structures. The silicon oxide layer is interposed between the conductive structures as a dielectric and insulating material. A low stress silicon nitride may be used as a vapor etch stop layer for a subsequent etching operation. A gas diffusion barrier layer is deposited close to the top of the MEMS device to prevent outgassing from a different device from diffusing through the MEMS device to the micro chamber. These various layers are formed using common semiconductor deposition and patterning techniques. The deposition techniques include but are not limited to chemical vapor deposition (CVD), physical vapor deposition (PVD) or ion beam deposition. The CVD may be plasma enhanced chemical vapor deposition ("PECVD"), atmospheric pressure CVD ("APCVD"), and a spin-on-glass (SOG) process. During polysilicon deposition using CVD, phosphine or arsine may be employed to render the polysilicon conductive. In some cases, diborane may be used as a dopant. The PVD may include sputtering. The patterning processes include photolithography and etching. A photoresist is deposited, exposed to a patterned light, developed, and used as an etch mask to remove a portion of underlying material. The remaining photomask is then removed. Common etch processes include dry etching and wet etching.

Figure 3:
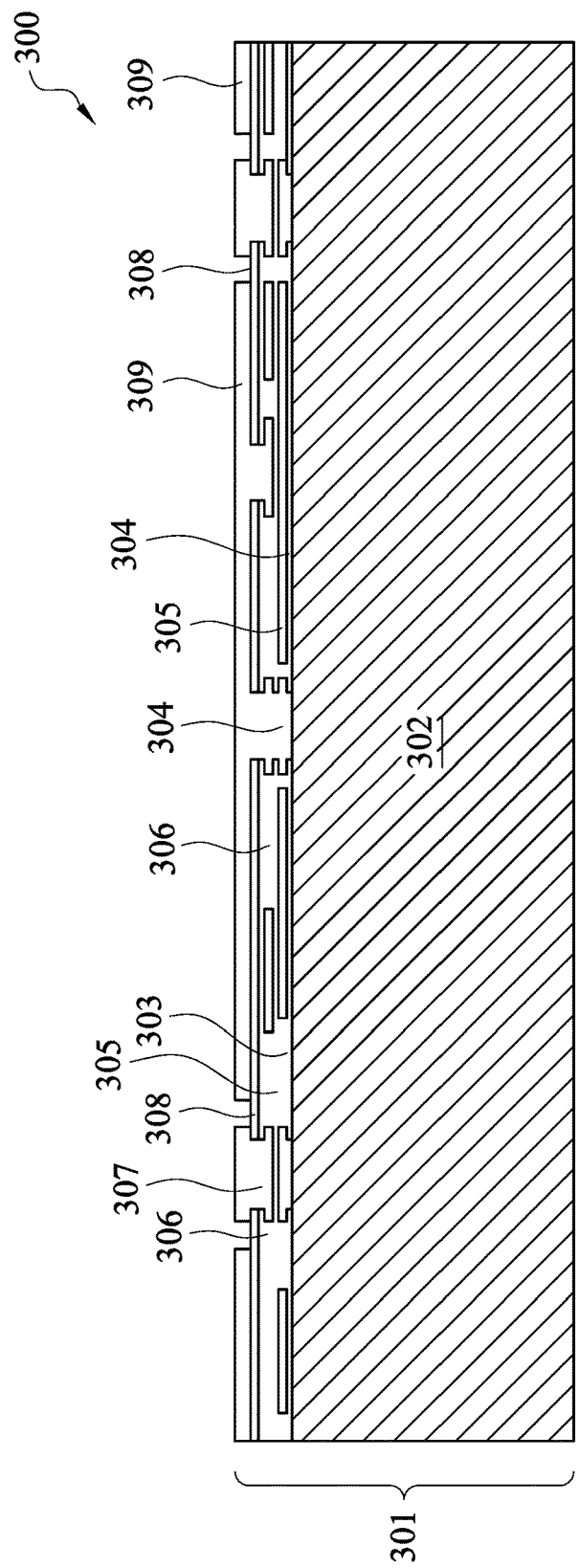
FIGS. 3-15 illustrate various intermediate stages of forming a semiconductor structure according to various embodiments.

FIG. 3 is a cross sectional diagram of a workpiece 300 including a MEMS device 301 that may be formed in operation 202. The MEMS device 301 includes a substrate 302 having various layered structures thereon. A patterned first silicon oxide layer 303 and a polysilicon layer 304 may be immediately adjacent to the substrate 302. The patterned first silicon oxide layer 303 will be removed in a subsequent process. A vapor etch stop layer 305 is disposed over the patterned first silicon oxide layer 303 and the polysilicon layer 304. A portion of the polysilicon layer 304 may be embedded in the vapor etch stop layer 305. A patterned second oxide layer 306 and further polysilicon layer 307 is disposed over the vapor etch stop layer 305. A gas diffusion barrier layer 308 is disposed over the second oxide layer 306 and further polysilicon layer 307. The gas diffusion barrier layer 308 is a passivation material that does not permit diffusion of particles from an underlying or overlying layer. The gas diffusion barrier layer 308 may be silicon nitride, low-stress silicon nitride, aluminum oxide, titanium oxide, tantalum oxide, hafnium oxide, hafnium silicate, zirconium oxide, or silicon zirconium oxide. A last polysilicon layer 309 is deposited over the gas diffusion barrier layer 308.

Figure 4:
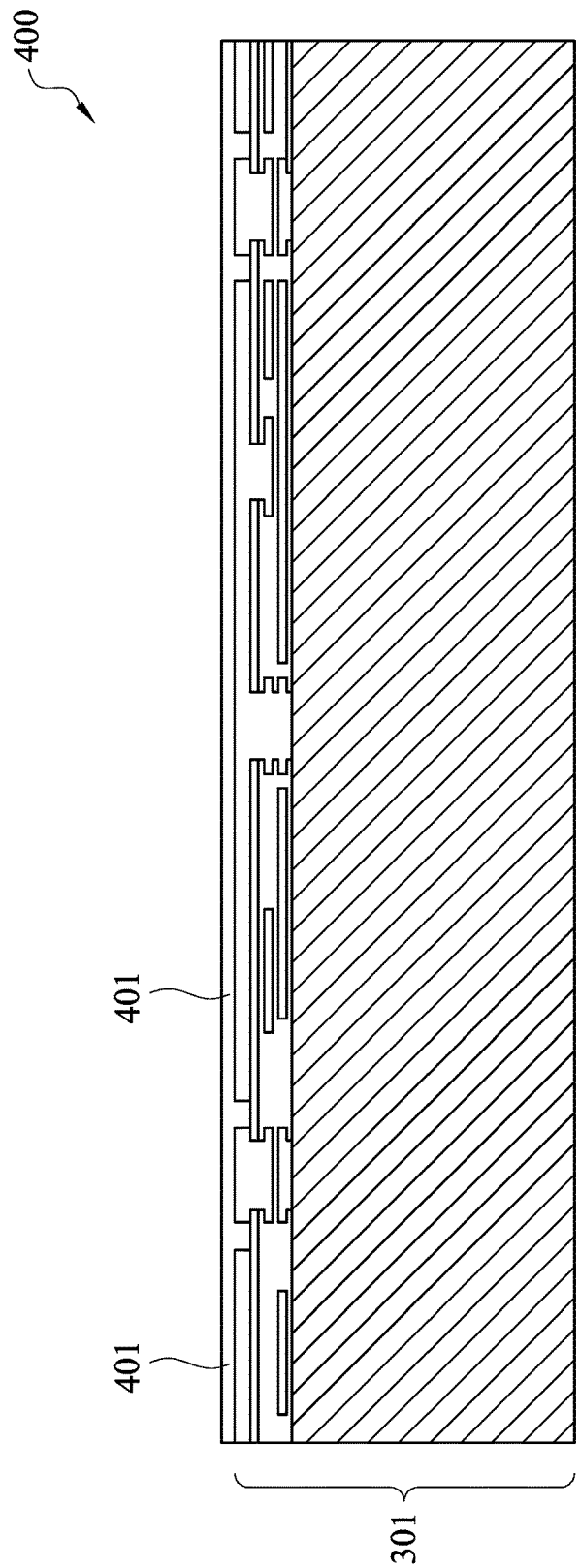

Referring to FIG. 2, at operation 204, a silicon oxide layer is deposited on the MEMS device. The oxide layer is deposited using a CVD process and planarized using a chemical mechanical polishing (CMP) process to promote fusion bonding. FIG. 4 is a cross sectional diagram of a workpiece 400 including the MEMS device 301 and an oxide layer 401 over the MEMS device 301.

Referring to FIG. 2, at operation 205, a plurality of vias is etched in a CMOS device layer on a CMOS substrate. The CMOS substrate is a semiconductor substrate, including silicon, SOT, or other commonly used semiconductor substrates. The CMOS device layer may be partially formed in the CMOS substrate and over the CMOS substrate. The CMOS device layer may include semiconductor devices such as transistors, inductors, capacitors, and resistors. An interconnect structure embedded in a dielectric material is formed over the semiconductor devices. The vias are etched in the device layer through the dielectric material to expose underlying CMOS substrate. The vias do not contact the interconnect structure in the device layer. The CMOS substrate and the CMOS device layer are the CMOS device, referred to as the second device 130 in the semiconductor structure 100 of FIG. 1.

Figure 5:
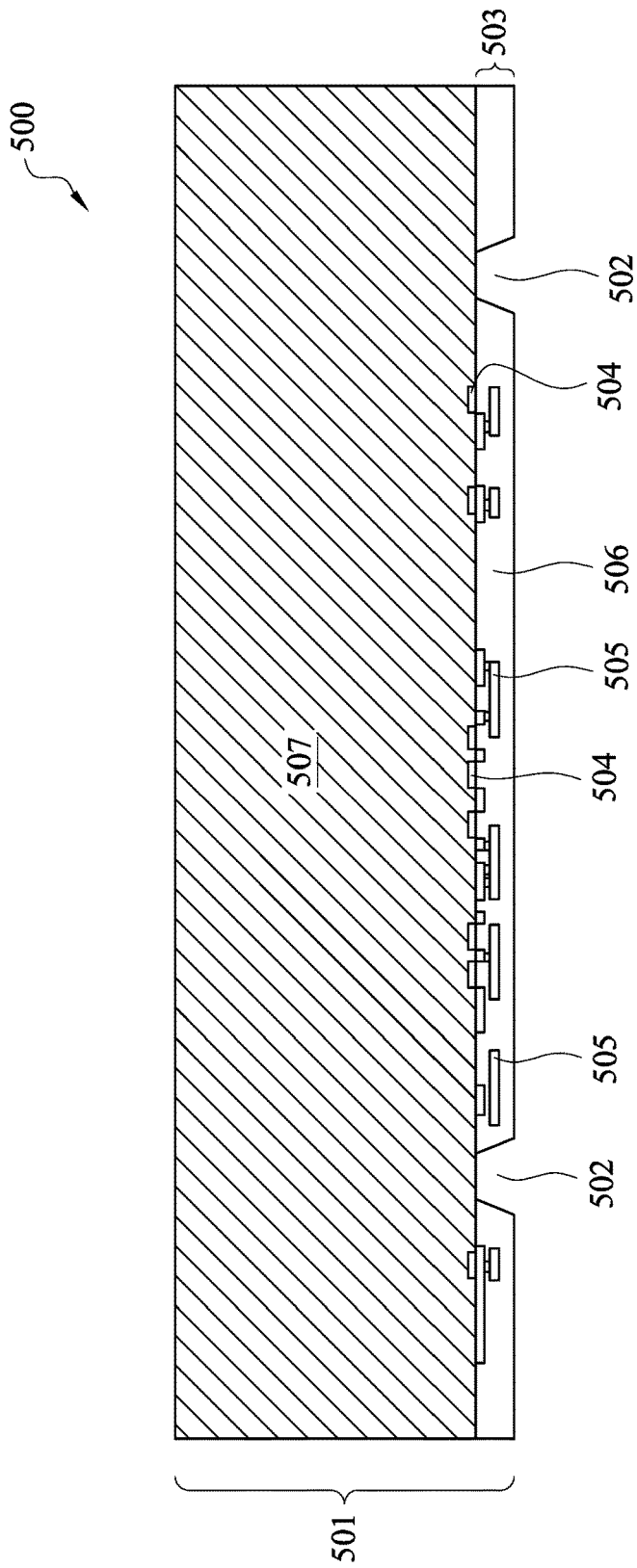

FIG. 5 is a cross sectional diagram of a workpiece 500 including a CMOS device 501 having a CMOS substrate 507 and vias 502 etched in a device layer 503. The device layer 503 includes semiconductor devices 504 and interconnect structure 505 within and under a dielectric material 506. The CMOS device is formed using CMOS processes known in the art. The various CMOS processes includes the deposition and etching processes discussed in association with the MEMS device and may also include implantation, epitaxial growth, and other commonly used semiconductor manufacturing processes. A number of vias 502, for example between 10 to 20, are formed per semiconductor product. These vias 502 are used in subsequent processing to form conductive through vias. The dielectric material 506 is planarized for fusion bonding with the MEMS device from FIG. 4.

Referring to FIG. 2, in operation 206, the MEMS device is bonded to the CMOS device. The bonding process may be a fusion bond of the oxide layer on the MEMS device to the dielectric material on the CMOS device. Before bonding, the surfaces are planarized and cleaned. In some embodiments, the devices are covered with water molecules, for example, by exposure to steam. The MEMS device and CMOS device are aligned and placed in contact with each other. Silanol groups across the interface polymerize and form an oxide to oxide bond. The devices may be annealed to increase the bonding strength and to remove water molecules that would diffuse along the interface. After bonding, in operation 208, the MEMS substrate is thinned. The substrate thinning process includes grinding and polishing the MEMS substrate to a very thin layer in the order of tens of microns, for example, less than 100 microns.

Figure 6:
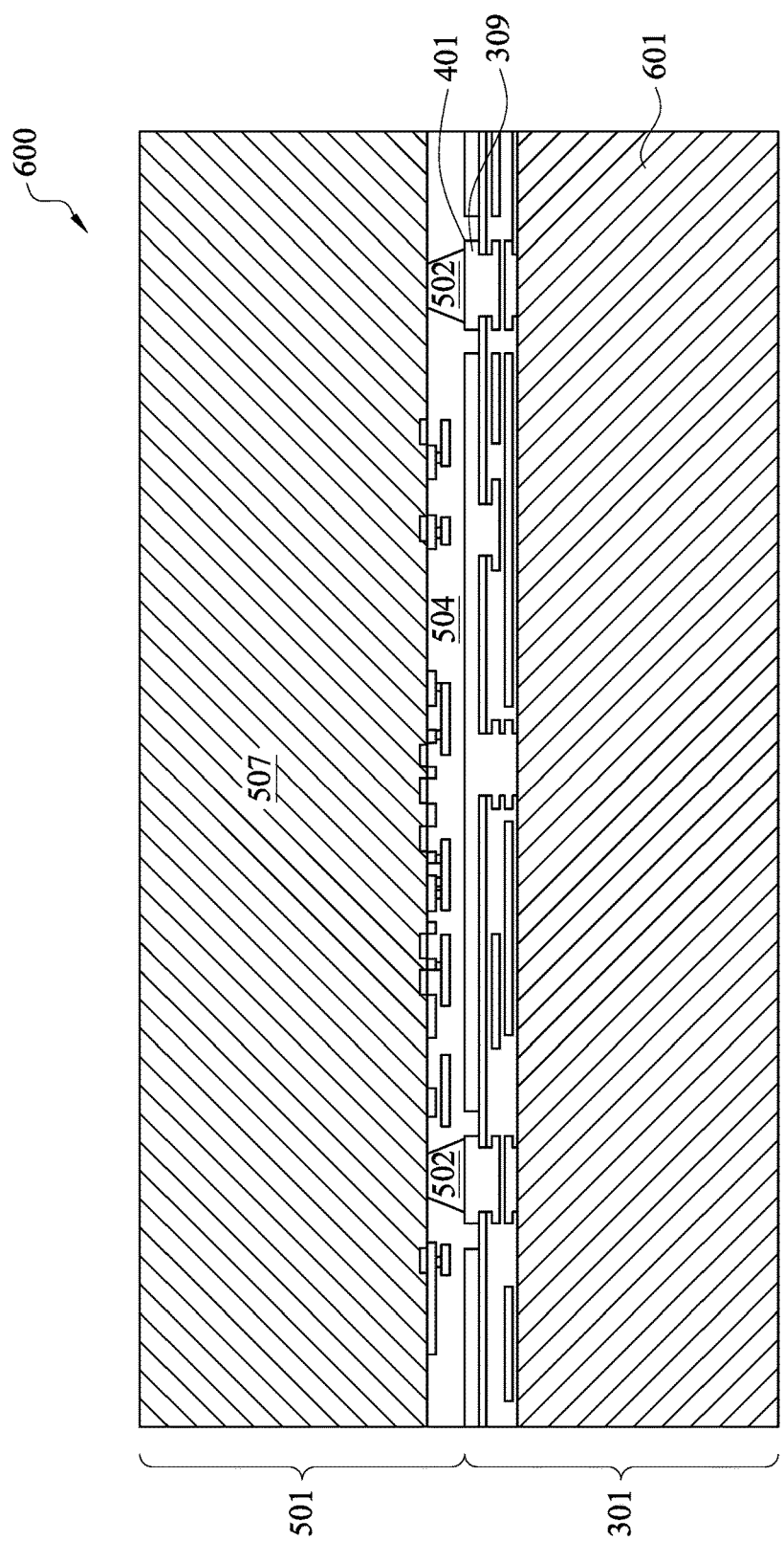

FIG. 6 is a cross-sectional diagram of a workpiece 600 having a CMOS device 501 and a thinned MEMS device 301 bonded to each other. Oxide layers on the device surfaces fuse together. When the oxide material is the same and the surfaces are properly prepared, the interface is not readily distinguishable. The vias 502 formed in operation 205 are disposed between the two devices 501 and 301. The vias 502 are surrounded by the dielectric material 506 on the sidewalls and have the CMOS substrate 507 on one end and an oxide layer 401 on an opposite end toward the MEMS device 301. The last polysilicon layer 309 abuts the oxide layer 401 on the MEMS device side. The thinned MEMS substrate 301 may be between about 10 and 100 microns, for example, about 50 microns.

Figure 7:
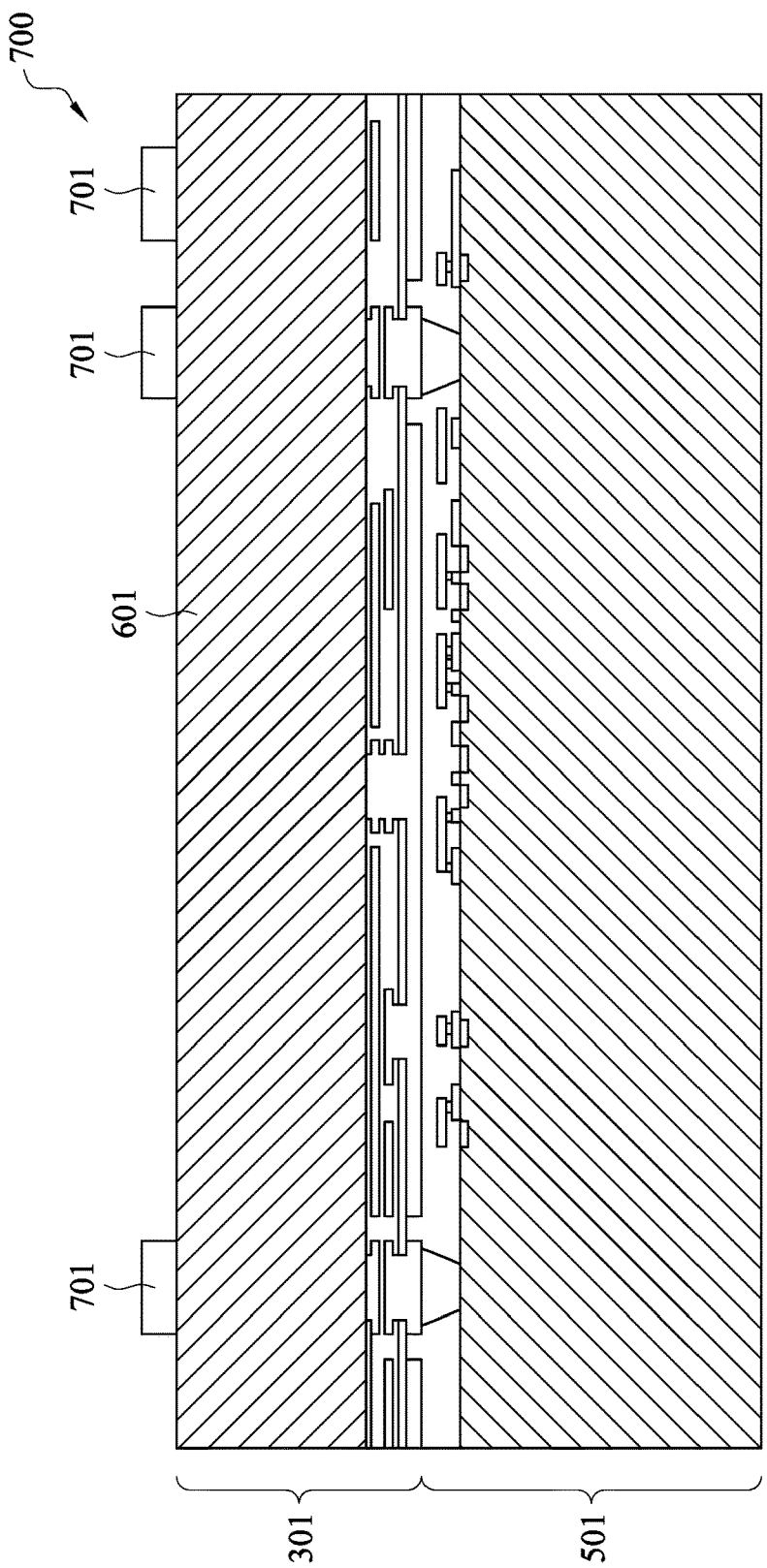

Referring to FIG. 2, in operation 210, a first bond metal layer is deposited and patterned on the thinned MEMS substrate. Depending on the metal material, the bond metal layer may be deposited first and then patterned and etched. Alternatively, a dielectric layer or a mask layer may be deposited and patterned first, and the first bond metal layer deposited in the pattern. The dielectric layer is removed along with bond metal material on the dielectric layer in CMP and etch process or in an ashing process, depending on the type of dielectric material used. FIG. 7 is a cross-sectional diagram of a workpiece 700 having a first bond metal 701 on the thinned MEMS substrate 301. The workpiece 700 is oriented in an opposite direction, or flipped, from workpiece 600 of FIG. 6.

Referring to FIG. 2, in operation 212, a suspended substrate structure is formed in the thinned MEMS substrate. The suspended substrate structure is formed by etching a pattern through the MEMS substrate 301 to an underlying oxide layer, and then removing the oxide layer by vapor etching so as to form a suspended structure. The MEMS substrate may be patterned and etched using a dry etch process. In various embodiments, the MEMS substrate is etched using a deep silicon etching technique using fluorine-containing gas to form trenches that expose an underlying oxide layer. The oxide layer is then removed using a vapor etchant, for example, a vapor hydrofluoric (HF) etchant. In other embodiments, the oxide layer is removed using a wet etch. The polysilicon layer and the vapor etch stop layer surrounding the oxide layer is not removed.

Figure 8:
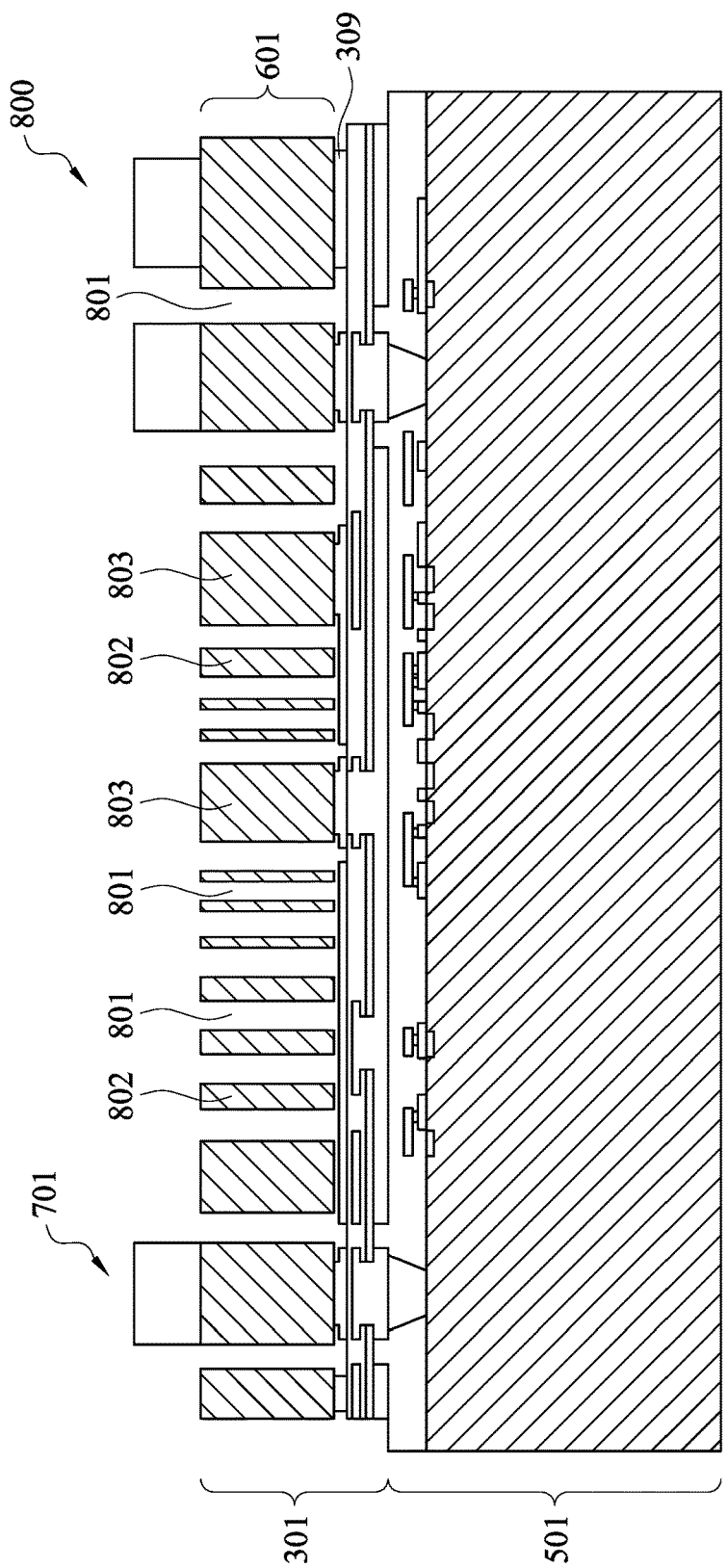

FIG. 8 is a cross-sectional diagram of a workpiece 800 including the suspended substrate structure 802, trenches 801 between the pattern of the suspended substrate structure 802, and anchors 803. The suspended substrate 802 is connected to the rest of the MEMS substrate 601 in a lateral connection by at least one anchor 803. Various patterns may be formed depending on the MEMS device. In one example, the suspended substrate structure 802 is a coil or grid. The anchors 803 contact a first polysilicon layer 304 which is not removed by the vapor etch. The suspended substrate structure 802 in the MEMS substrate 601 is referred to as the MEMS device layer.

Referring to FIG. 2, in operation 214, a cap wafer is bonded on the thinned MEMS substrate. The cap wafer may be a semiconductor wafer, a glass substrate, a quartz substrate, or other suitable material. The cap wafer may include cavities or trenches formed in one side of the cap wafer and a second bond metal layer. The cap wafer may be bonded to the MEMS device by eutectic bonding of two metals. Eutectic bonding of two metals that each adheres to the substrate can is mechanically strong and can hermetically seal a cavity between the cap wafer and the MEMS device. Suitable eutectic metals include AlCu, AlGe, In, Au, Sn, Cu, Zr, Ba, Ti, Al, or their alloys. One or more of these metals may be a first bond metal or a second bond metal. The two bond metals, one from the cap wafer and one from the MEMS device, are aligned and placed together. With heat and pressure, the metals form a eutectic compound. Different pressures and temperatures are used depending on the materials. Eutectic bonding is achieved at a temperature much lower than the melting temperature of the respective metals. Because a eutectic compound is formed, there may be no discernible interface between the bond metals. The bonding is performed in a vacuum environment. When a hermetic seal is formed, the inner cavities around which the seal forms remains in a vacuum even when the workpiece is removed from the vacuum environment. According to various embodiments, the vacuum environment is less than several hundred mbar, for example, between about 0.1 mbar and tens of mbar.

Figure 9:
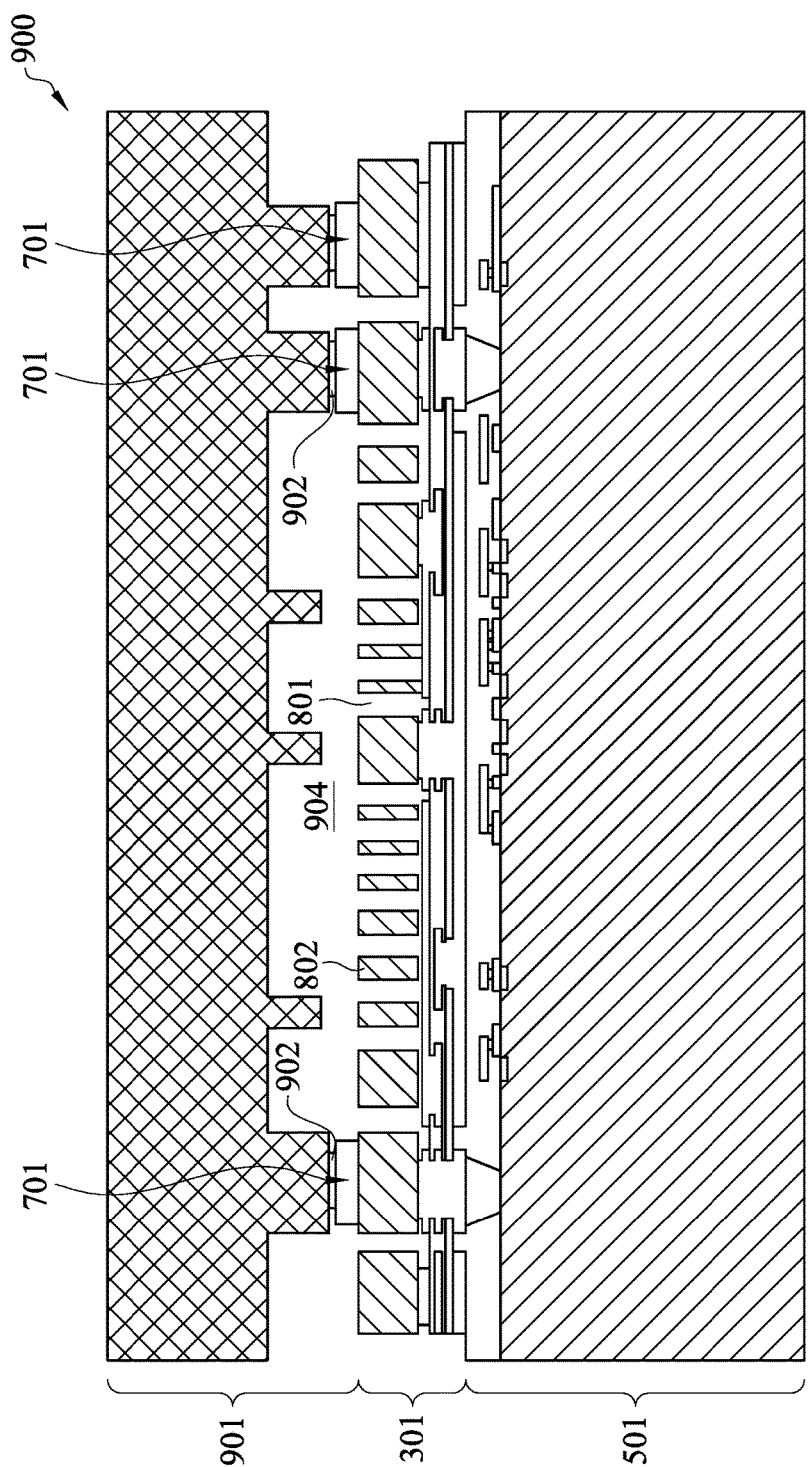

FIG. 9 is a cross-sectional diagram of a workpiece 900 including a cap wafer 901, a MEMS device 301, and a CMOS device 501. A hermetic seal including a first bond metal 701 and a second bond metal 902 surrounds and seals a micro chamber 904 between the cap wafer 901 and the MEMS device 301. Additional bonding metal may be included that is not used as a hermetic seal. For example, the workpiece 900 includes a metal bond 905 that may not seal a micro chamber and is disposed between the cap wafer 901 and MEMS device 301. The micro chamber 904 includes cavities in the cap wafer 901 and the trenches 801 formed in operation 212 of FIG. 2, as well as through wall openings underlying the trench walls of the suspended substrate structure 802.

Figure 10:
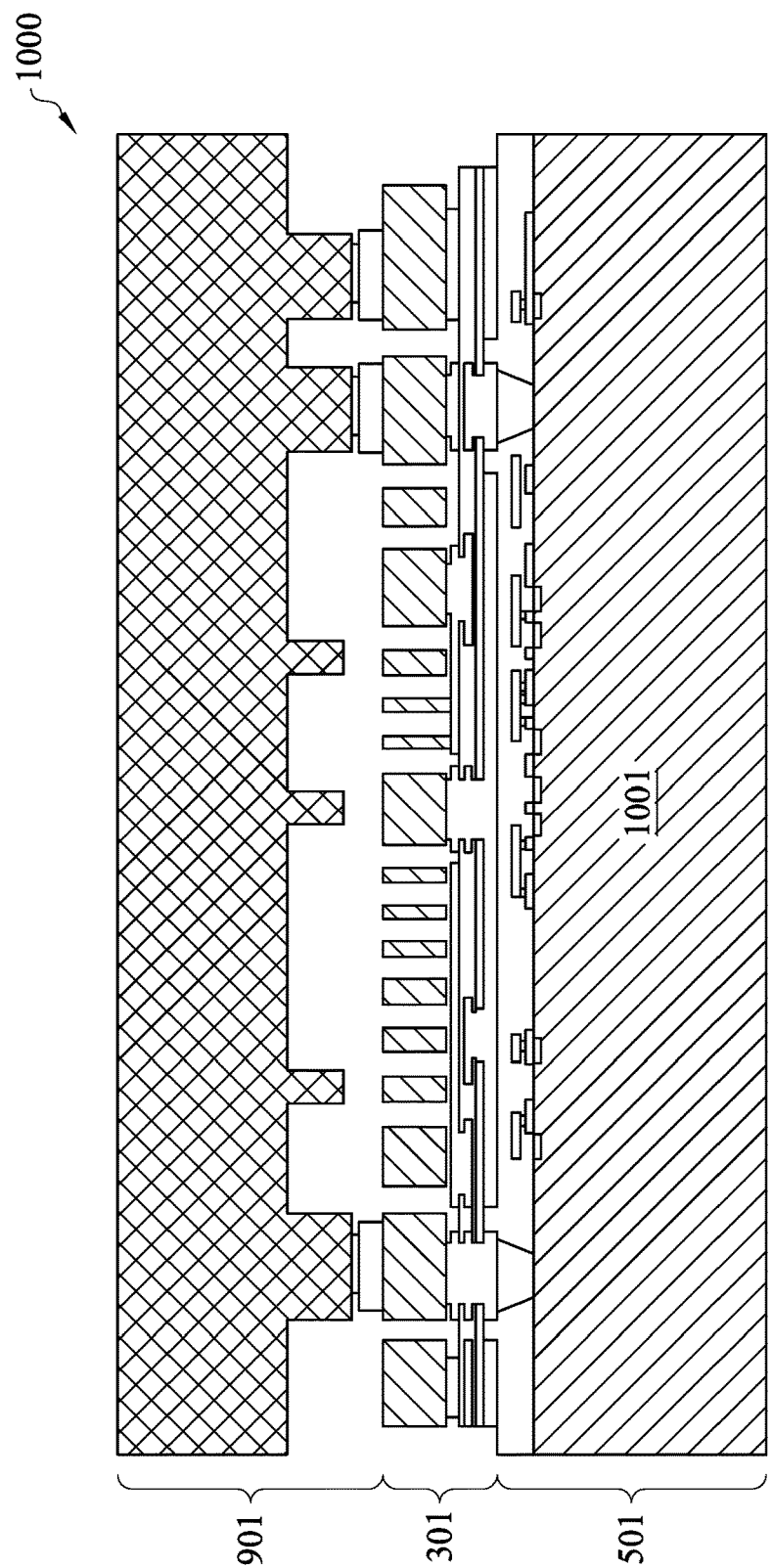

Referring to FIG. 2, in operation 216, the CMOS substrate is thinned. The thinning process includes grinding and polishing the CMOS substrate to a thickness in the order of low hundreds of microns, for example, between about 100 microns and 200 microns. FIG. 10 is a cross-sectional diagram of a workpiece 1000 including a cap wafer 901, a MEMS device 301, and a CMOS device 501. The CMOS substrate 1001 of the CMOS device 501 is thinned.

Referring to FIG. 2, in operation 218, through vias are etched through a backside of the CMOS substrate to expose the vias in the CMOS device layer. The through vias may be etched using one or more known semiconductor techniques, such as wet etch, dry etch, energy beam (laser beam, ion beam, etc.). In the same operation or in a separate operation, the oxide layer deposited on the MEMS device before fusion bonding is also removed. The oxide layer removal exposes the interconnect structure of the MEMS device, for example, a last polysilicon layer. The through etch may be performed using an etch mask, for example, by patterning the workpiece from a backside of the CMOS substrate. The through etch may also be performed by selective beaming at desired locations. In some embodiments, one or more alignment marks or other position markers visible by machine inspection from a backside of the CMOS substrate may be included on a front side of the CMOS substrate to aid positioning of the energy beam.

Figure 11:
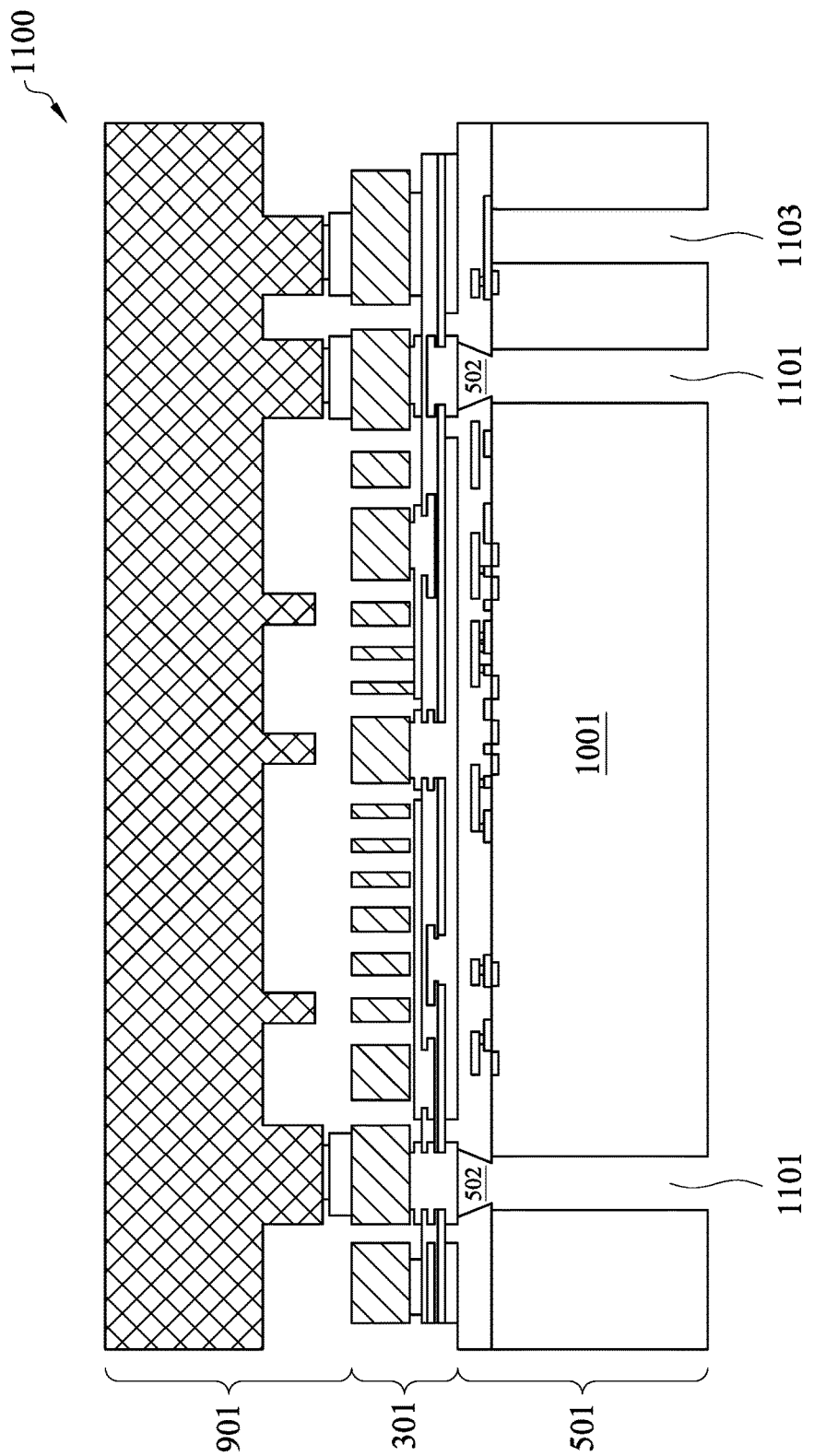

FIG. 11 is a cross-sectional diagram of a workpiece 1100 after the through via etch and oxide layer removal of operation 218. FIG. 11 includes a cap wafer 901, a MEMS device 301, and a CMOS device 501. Through vias 1101 are etched in the CMOS substrate 1001 to contact the vias 502 formed in operation 205. One or more vias 1103 may also be formed in the substrate 1001 to contact metal layers in the CMOS device 501. The etching of through vias 1101 and vias 1103 are the same because the same amount of substrate 1001 is removed. The through vias 1101 and vias 1103 may be tens of microns wide, for example, 15 microns. The through vias 1101 exposes a conductive layer, for example, last polysilicon layer 309 of FIG. 3, in the MEMS device 301.

Figure 12:
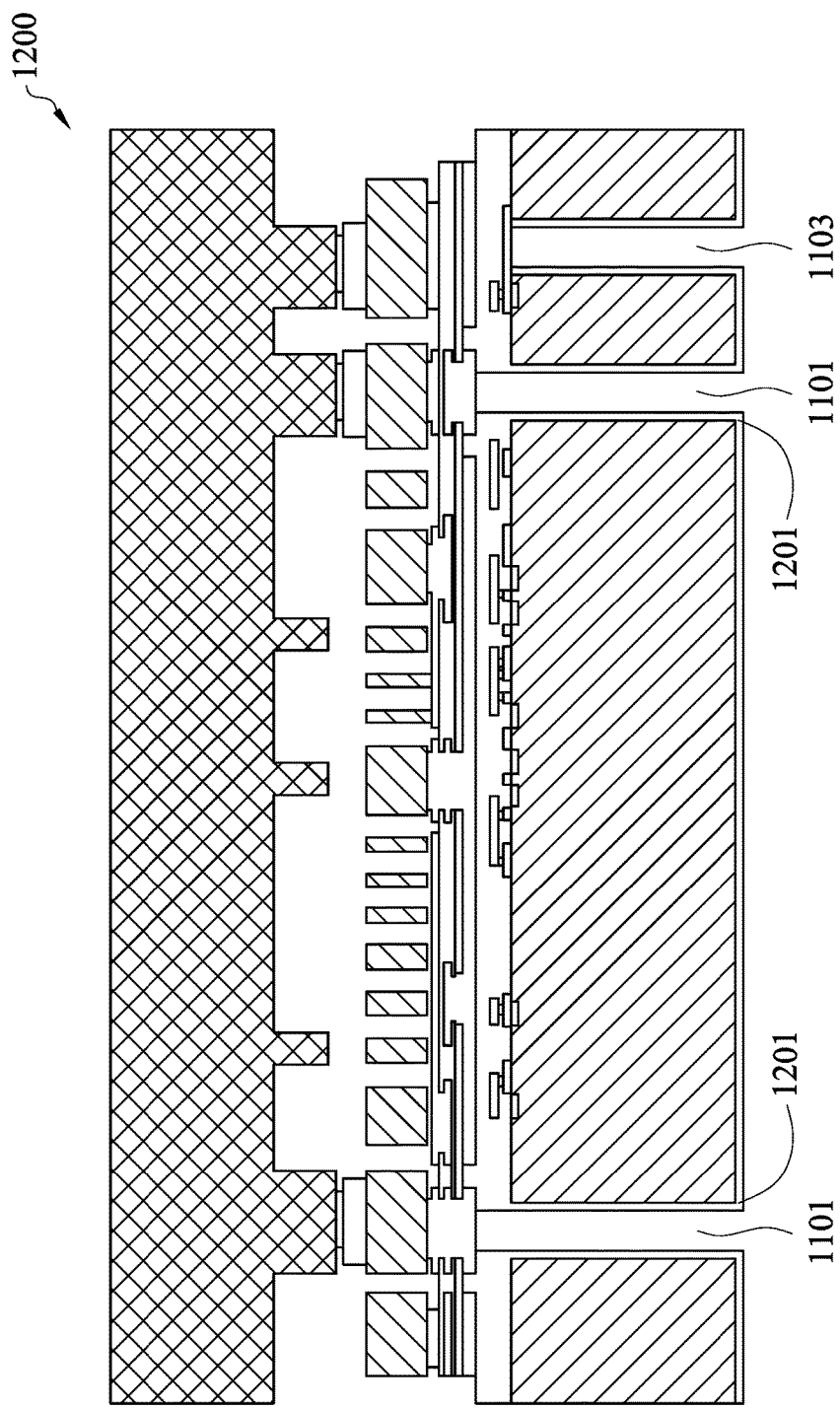

Referring to FIG. 2, in operation 220, oxides are deposited in the through vias and etched back to expose the conductive structures. The oxides are deposited from a backside of the workpiece to passivate the via walls. A CVD process may be used. In some embodiments, the CVD process is a low temperature process to minimize usage of a thermal budget. The oxides are deposited in sufficient thickness to ensure complete sidewall coverage and prevent any electrical current from a conductor in the through via to cross into the substrate. The oxides are etched back to expose conductive structures on the MEMS device and CMOS device. The etch back process uses bias to direct the etchant, for example, ions in a plasma, toward a bottom (MEMS device) of the through vias 1101 and a bottom (CMOS interconnect) of the vias 1103. FIG. 12 is a cross-sectional diagram of a workpiece 1200 after operation 220. The workpiece 1200 includes oxide layer 1201 in the sidewalls of through vias 1101 and vias 1103. The bottoms of the through vias 1101 and vias 1103 are exposed conductive structures.

Referring to FIG. 2, in operation 222, a conductive material is deposited and patterned in the through vias and on portions of the thinned CMOS substrate. The conductive material may be copper deposited using a seed layer (PVD) and bulk copper (electroplating). In some embodiments, the conductive material may completely fill the through vias and vias. In other embodiments, only a portion of the through vias and vias is filled, for example, at the bottom and along the sidewalls. Other conductive materials may be used, for example, aluminum, alloys of aluminum and copper, tungsten, nickel, and other commonly used semiconductor conductors. After the conductive material is deposited, it is then patterned and etched. The patterning separates the conductive material according to electrical output design. For example, conductive material may be associated with one through via and one conductive bump.

Figure 13:
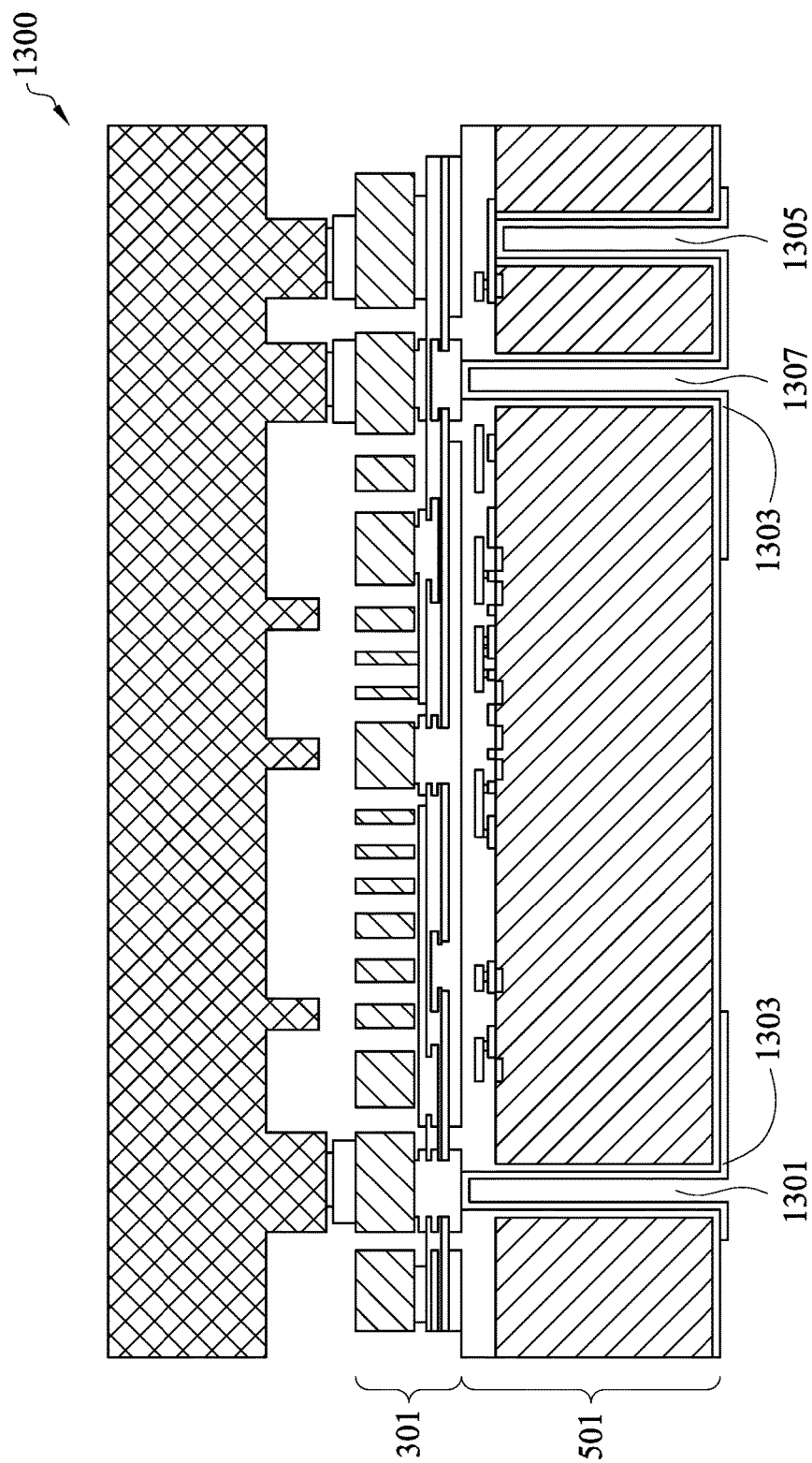

FIG. 13 is cross-sectional diagram of a workpiece 1300 after operation 222 of FIG. 2. The workpiece 1300 includes conductive through vias (1301, 1307) that electrically connects the MEMS device 301 to a backside of the CMOS device 501 using a conductor 1303. As shown, the conductor 1303 does not completely fill the through via. At the bottom of the conductive through via 1301, conductor 1303 directly connect to an interconnect structure in the MEMS device 301. The workpiece 1300 also includes conductive via 1305 that electrically connects the CMOS device interconnects to a backside of the CMOS device 501. As shown, the conductor in the conductive via 1305 also connects to the interconnect structure of the MEMS device. Thus, the conductor 1303 not only acts as an external electrode to the conductive bump, but also can route signals between the CMOS device 501 and the MEMS device 301 without going through the conductive bumps. In some embodiments, the conductors that routes signal between the MEMS device 301 and the CMOS device 501 may not be connected to an external conductive bump.

Figure 14:
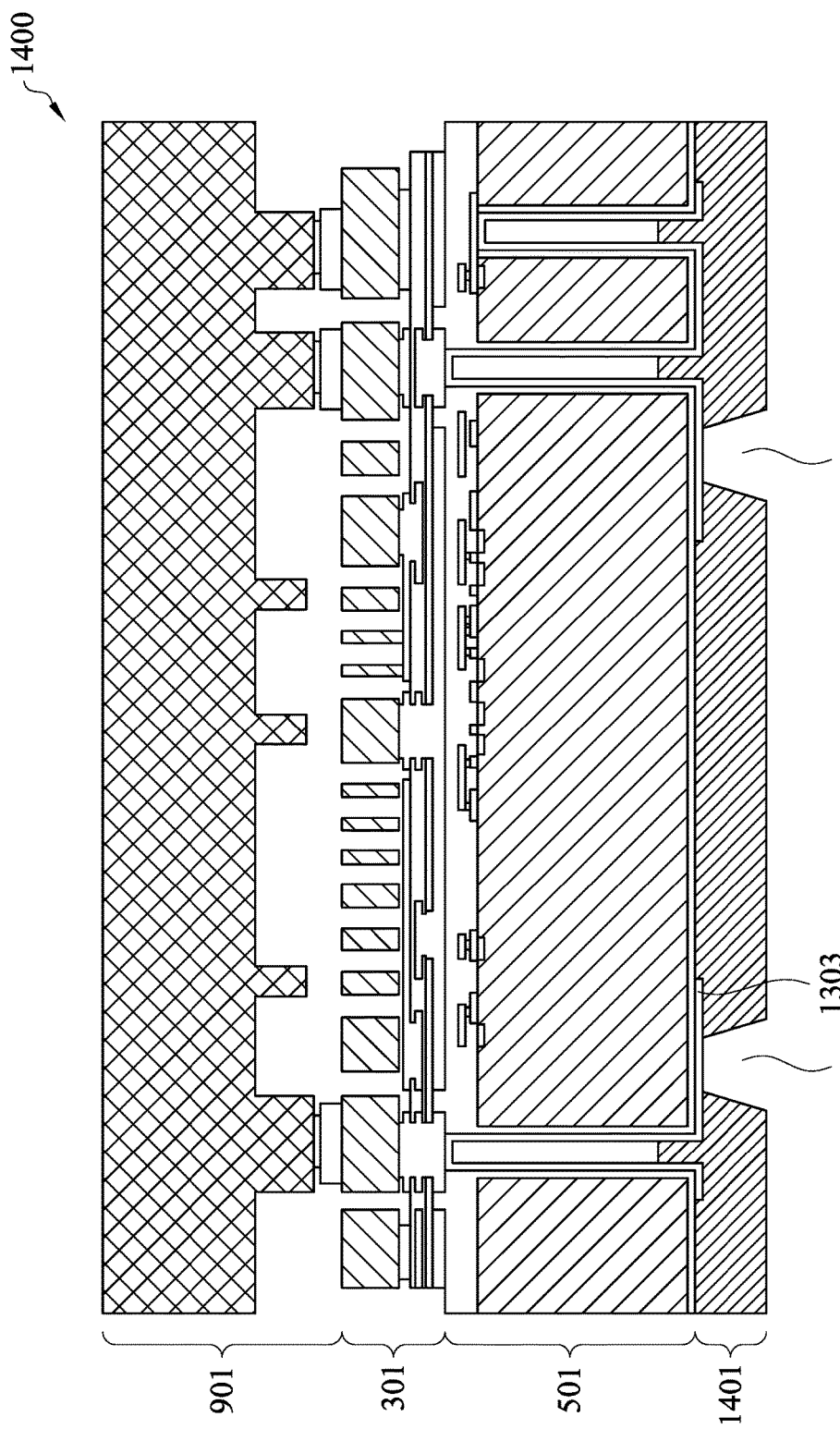
Figure 15:
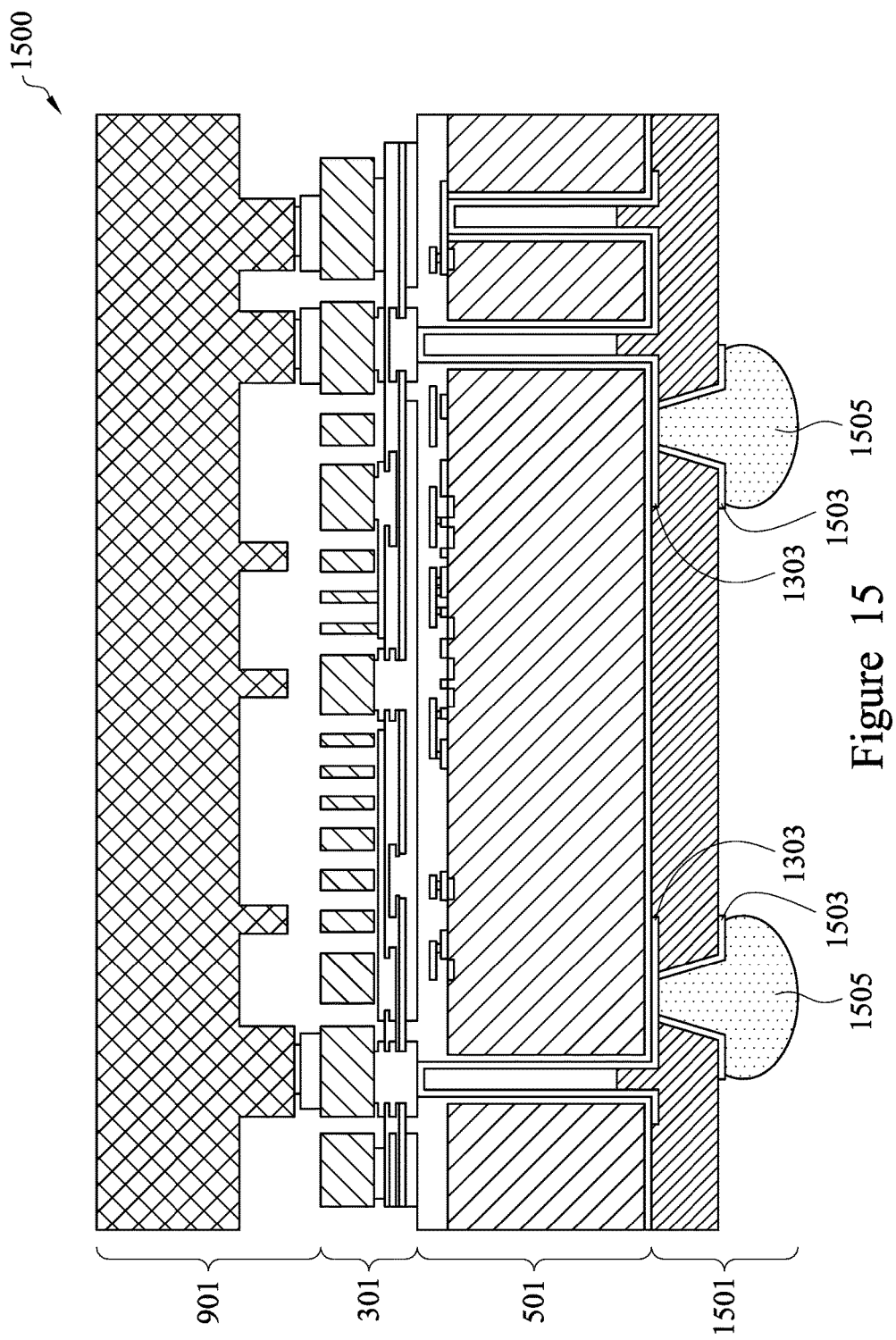

Referring to FIG. 2, in operation 224, conductive bumps are formed over the patterned conductive material, i.e., the conductors of FIG. 13. The conductive bumps are formed by first coating a bump passivation layer over the conductive material, patterning the bump passivation layer to form openings and expose the conductive material, deposit a conductive liner in the openings, and conductive bump material to fill and protrude from the openings. The conductive bumps form a ball grid array (BGA) on the backside of the workpiece. FIG. 14 is cross-sectional diagram of a workpiece 1400 after forming and patterning a bump passivation layer 1401. The bump passivation layer may be formed of any commonly used material around conductive bumps. Examples include different types of epoxies, for example bismaleimide-triazine resin, polyimide, other thermoplastic polymers, and combinations of these. Workpiece 1400 includes openings 1402 in the bump passivation layer 1401 that exposes the conductors 1303. FIG. 15 is a cross-sectional diagram of a workpiece 1500 having a completed conductive bump structure 1501. An underbump metal layer 1503 contacts the conductor 1303 and is disposed between the conductive bumps 1505 and the conductors 1303. The conductive bump 1505, as shown, fills the openings 1402 from FIG. 14 and protrudes above the opening on the underbump metal layer 1503. Depending on the conductive bump material and the geometry of the underbump metal layer 1503, different conductive bump shapes may be formed. In some embodiments, the conductive bumps are hemispheric domes, hemi-ellipsoid domes, or cylindrical pillars. Any typical bump material may be used. After forming the conductive bumps, the workpiece may be singulated and incorporated into a product device.

In an embodiment, a method includes: forming a MEMS device on a MEMS substrate; depositing an oxide layer on the MEMS substrate; etching a plurality of openings in a CMOS device layer on a CMOS substrate; bonding the oxide layer to the CMOS device layer; thinning the MEMS substrate; depositing a first bond metal layer on the thinned MEMS substrate; forming a suspended substrate structure in the thinned MEMS substrate; bonding a cap wafer on the thinned MEMS substrate; thinning the CMOS substrate; etching a plurality of through vias through a backside of the CMOS substrate to expose the openings in the CMOS device layer; depositing oxides in the through vias; depositing and patterning conductive material in the through vias and on portions of the thinned CMOS substrate; and forming a plurality of bumps over the patterned conductive material.

In some embodiments, the bonding a cap wafer includes heating to a first temperature in a range of approximately 100 C to approximately 500 C and applying a pressure in a range of approximately 10 KN to approximately 100 KN in a vacuum environment. In some embodiments, the bonding the oxide layer to the CMOS substrate is an oxide-oxide fusion bonding. In some embodiments, the thinned MEMS substrate is less than 50 microns. In some embodiments, forming a suspended substrate structure includes: etching vias in the thinned MEMS substrate to expose an oxide layer, and exposing the oxide layer to a vapor etchant to remove the oxide layer including oxide layer under the thinned MEMS substrate. In some embodiments, the etching the through vias through the backside of the CMOS substrate also removes exposed oxide layer on the MEMS substrate.

In an embodiment, a method includes: forming a MEMS device including: forming an interconnect on a MEMS substrate, the interconnect including first conductive features and a first dielectric layer on the first conductive features; and forming suspended structures in the MEMS substrate; forming a CMOS device including: forming a device layer on a CMOS substrate, the device layer including second conductive features and a second dielectric layer on the second conductive features; and forming a plurality of openings in the device layer; bonding the first dielectric layer to the second dielectric layer such that the first conductive features of the MEMS device are exposed to respective ones of the openings in the device layer of the CMOS device; etching a plurality of through vias in the CMOS substrate, a first subset of the through vias exposing the first conductive features of the MEMS device through the openings in the device layer, a second subset of the through vias exposing the second conductive features of the CMOS device; and depositing a conductive material on the CMOS substrate and in the through vias to form a plurality of conductive vias, the conductive vias in the first subset of the through vias electrically connected to the first conductive features of the MEMS device, the conductive vias in the second subset of the through vias electrically connected to the second conductive features of the CMOS device.

In some embodiments, the method further includes: depositing a bond metal layer on the MEMS substrate. In some embodiments, the bond metal layer is formed from conductive materials selected from the group including of indium, gold, tin, copper, aluminum, germanium, and combinations thereof. In some embodiments, the method further includes: forming a plurality of cavities in a capping wafer; and bonding the capping wafer to the bond metal layer. In some embodiments, bonding the capping wafer forms a hermetic seal between the MEMS substrate and the capping wafer, the hermetic seal forming a plurality of micro chambers, the suspended structures of the MEMS device exposed to the micro chambers. In some embodiments, the MEMS substrate has a first surface and a second surface opposite the first surface, the interconnect formed on the first surface, the bond metal layer formed on the second surface. In some embodiments, the CMOS substrate has a first surface and a second surface opposite the first surface, the device layer formed on the first surface, the conductive material deposited on the second surface. In some embodiments, the method further includes: forming a plurality of conductive bumps on the second surface of the CMOS substrate, a first subset of the plurality of conductive bumps electrically connected to the first conductive features of the MEMS device, a second subset of the plurality of conductive bumps electrically connected to the second conductive features of the CMOS device. In some embodiments, the MEMS device is a gyroscope or an accelerometer.

In an embodiment, a method includes: providing a CMOS device including a plurality of conductive bumps on a first side and an active device layer on a second side, the active device layer electrically coupled to a first subset of the conductive bumps with first conductive vias extending into the CMOS device; bonding a MEMS device to the CMOS device, the MEMS device including an interconnect on a first side and a bond metal layer on a second side, the interconnect of the MEMS device bonded to the active device layer of the CMOS device, where after the bonding, the interconnect is electrically coupled to a second subset of the conductive bumps with second conductive vias extending into the CMOS device further than the first conductive vias; and bonding a capping wafer to the bond metal layer of the MEMS device with a hermetric seal, where the hermetric seal and the capping wafer form a plurality of micro chambers, the MEMS device exposed to the micro chambers.

In some embodiments, the method further includes: forming the interconnect on a MEMS substrate; and etching the MEMS substrate to form suspended substrate structures in the MEMS substrate. In some embodiments, after bonding the capping wafer, the suspended substrate structures are exposed to the micro chambers. In some embodiments, the method further includes: forming the active device layer on a CMOS substrate; and forming openings in the active device layer. In some embodiments, the first conductive vias extend through the CMOS substrate, and the second conductive vias extend through the CMOS substrate and the openings in the active device layer.

Although the present embodiments and their advantages have been described in detail, it should be understood that various changes, substitutions, and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a MEMS device on a MEMS substrate;
    depositing an oxide layer on the MEMS substrate;
    etching a plurality of openings in a CMOS device layer on a CMOS substrate;
    bonding the oxide layer to the CMOS device layer;
    thinning the MEMS substrate;
    depositing a first bond metal layer on the thinned MEMS substrate;
    forming a suspended substrate structure in the thinned MEMS substrate;
    bonding a cap wafer on the thinned MEMS substrate;
    thinning the CMOS substrate;
    etching a plurality of through vias through a backside of the CMOS substrate to expose the openings in the CMOS device layer;
    depositing oxides in the through vias;
    depositing and patterning conductive material in the through vias and on portions of the thinned CMOS substrate; and
    forming a plurality of bumps over the patterned conductive material.

2. The method of claim 1, wherein the bonding a cap wafer comprises heating to a first temperature in a range of approximately 100° C. to approximately 500° C. and applying a pressure in a range of approximately 10 KN to approximately 100 KN in a vacuum environment.

3. The method of claim 1, wherein the bonding the oxide layer to the CMOS substrate is an oxide-oxide fusion bonding.

4. The method of claim 1, wherein the thinned MEMS substrate is less than 50 microns.

5. The method of claim 1, wherein forming a suspended substrate structure comprises:
    etching vias in the thinned MEMS substrate to expose an oxide layer, and
    exposing the oxide layer to a vapor etchant to remove the oxide layer including oxide layer under the thinned MEMS substrate.

6. The method of claim 1, wherein the etching the through vias through the backside of the CMOS substrate also removes exposed oxide layer on the MEMS substrate.

7. A method comprising:
    forming a MEMS device comprising:
        forming an interconnect on a MEMS substrate, the interconnect comprising first conductive features and a first dielectric layer on the first conductive features; and
        forming suspended structures in the MEMS substrate;
    forming a CMOS device comprising:
        forming a device layer on a CMOS substrate, the device layer comprising second conductive features and a second dielectric layer on the second conductive features; and
        forming a plurality of openings in the device layer;
    bonding the first dielectric layer to the second dielectric layer such that the first conductive features of the MEMS device are exposed to respective ones of the openings in the device layer of the CMOS device;
    etching a plurality of through vias in the CMOS substrate, a first subset of the through vias exposing the first conductive features of the MEMS device through the openings in the device layer, a second subset of the through vias exposing the second conductive features of the CMOS device; and
    depositing a conductive material on the CMOS substrate and in the through vias to form a plurality of conductive vias, the conductive vias in the first subset of the through vias electrically connected to the first conductive features of the MEMS device, the conductive vias in the second subset of the through vias electrically connected to the second conductive features of the CMOS device.

8. The method of claim 7, further comprising:
    depositing a bond metal layer on the MEMS substrate.

9. The method of claim 8, wherein the bond metal layer is formed from conductive materials selected from the group consisting of indium, gold, tin, copper, aluminum, germanium, and combinations thereof.

10. The method of claim 8, further comprising:
    forming a plurality of cavities in a capping wafer; and
    bonding the capping wafer to the bond metal layer.

11. The method of claim 10, wherein bonding the capping wafer forms a hermetic seal between the MEMS substrate and the capping wafer, the hermetic seal forming a plurality of micro chambers, the suspended structures of the MEMS device exposed to the micro chambers.

12. The method of claim 8, wherein the MEMS substrate has a first surface and a second surface opposite the first surface, the interconnect formed on the first surface, the bond metal layer formed on the second surface.

13. The method of claim 7, wherein the CMOS substrate has a first surface and a second surface opposite the first surface, the device layer formed on the first surface, the conductive material deposited on the second surface.

14. The method of claim 13, further comprising:
    forming a plurality of conductive bumps on the second surface of the CMOS substrate, a first subset of the plurality of conductive bumps electrically connected to the first conductive features of the MEMS device, a second subset of the plurality of conductive bumps electrically connected to the second conductive features of the CMOS device.

15. The method of claim 7, wherein the MEMS device is a gyroscope or an accelerometer.

16. A method comprising:
    providing a CMOS device comprising a plurality of conductive bumps on a first side and an active device layer on a second side, the active device layer electrically coupled to a first subset of the conductive bumps with first conductive vias extending into the CMOS device;
    bonding a MEMS device to the CMOS device, the MEMS device comprising an interconnect on a first side and a bond metal layer on a second side, the interconnect of the MEMS device bonded to the active device layer of the CMOS device, wherein after the bonding, the interconnect is electrically coupled to a second subset of the conductive bumps with second conductive vias extending into the CMOS device further than the first conductive vias; and bonding a capping wafer to the bond metal layer of the MEMS device with a hermetric seal, wherein the hermetric seal and the capping wafer form a plurality of micro chambers, the MEMS device exposed to the micro chambers.

17. The method of claim 16, further comprising:
forming the interconnect on a MEMS substrate; and
etching the MEMS substrate to form suspended substrate structures in the MEMS substrate.

18. The method of claim 17, wherein after bonding the capping wafer, the suspended substrate structures are exposed to the micro chambers.

19. The method of claim 16, further comprising:
forming the active device layer on a CMOS substrate; and
forming openings in the active device layer.

20. The method of claim 19, wherein the first conductive vias extend through the CMOS substrate, and the second conductive vias extend through the CMOS substrate and the openings in the active device layer.

* * * * *